United States Patent [19]
Ho et al.

[11] Patent Number: 5,747,866
[45] Date of Patent: May 5, 1998

[54] APPLICATION OF THIN CRYSTALLINE SI$_3$N$_4$ LINERS IN SHALLOW TRENCH ISOLATION (STI) STRUCTURES

[75] Inventors: Herbert Ho, Washingtonville; Erwin Hammerl, Stromville; David M. Dobuzinsky, Hopewell Junction; Herbert Palm, Wappingers Falls, all of N.Y.; Stephen Fugardi, New Milford, Conn.; Atul Ajmera, Wappinger, N.Y.; James F. Moseman, Dover Plains, N.Y.; Samuel C. Ramac, Wappingers Falls, N.Y.

[73] Assignee: Siemens Aktiengesellschaft, Munich, Germany

[21] Appl. No.: 785,322

[22] Filed: Jan. 21, 1997

Related U.S. Application Data

[62] Division of Ser. No. 531,844, Sep. 21, 1995.
[51] Int. Cl.$^6$ .................................................. H01L 29/00
[52] U.S. Cl. ........................... 257/506; 257/510; 257/649
[58] Field of Search ................................... 257/649, 506, 257/510

[56] References Cited

U.S. PATENT DOCUMENTS

| | | | |
|---|---|---|---|
| 4,918,028 | 4/1990 | Shirai | 437/81 |
| 5,085,711 | 2/1992 | Iwamoto et al. | 136/258 |

Primary Examiner—Sara W. Crane
Assistant Examiner—Douglas A. Wille
Attorney, Agent, or Firm—Donald B. Paschburg

[57] ABSTRACT

Silicon integrated circuits use a crystalline layer of silicon nitride (Si$_3$N$_4$) in shallow trench isolation (STI) structures as an O$_2$-barrier film. The crystalline Si$_3$N$_4$ lowers the density of electron traps as compared with as-deposited, amorphous Si$_3$N$_4$. Further, a larger range of low-pressure chemical-vapor deposited (LPCVD) Si$_3$N$_4$ films can be deposited, providing a larger processing window for thickness controllability. An LPCVD-Si$_3$N$_4$ film is deposited at temperatures of 720° C. to 780° C. The deposited film is in an amorphous state. Subsequently, a high-temperatures rapid-thermal anneal in pure nitrogen or ammonia is conducted at 1050° C. to 1100° for 60 seconds.

13 Claims, 3 Drawing Sheets

APPLICATION OF THIN CRYSTALLINE SI$_3$N$_4$ LINERS IN SHALLOW TRENCH ISOLATION (STI) STRUCTURES

This is divisional of application Ser. No. 08/531,844 filed Sep. 21, 1995.

FIELD OF THE INVENTION

The present invention generally relates to the manufacture of submicron integrated circuits and, more particularly, to the application of thin silicon nitride (Si$_3$N$_4$) films in shallow trench (STI) structures as O$_2$-barrier films.

BACKGROUND DESCRIPTION

One of the most critical parameters affecting silicon integrated circuit functionality and yield is the amount of stress that is developed within the silicon substrate during device processing. Stresses, exceeding the mechanical yield strength of silicon (Si), will form Si crystal defects (e.g., dislocations and stacking faults), adversely affecting device performance and yield. A prominent source of stress occurs during the isolation process of electrical devices. Shallow trench isolation (STI) is used for features designed a 0.5 µm or less. This process includes etching a "shallow" trench (i.e., 0.5 µm or less), growing a thin oxide immediately after etch, filling the trench with a dielectric (i.e., deposited oxide), "densifying" the dielectric, either by oxidizing the dielectric or using a high-temperature anneal in an inert ambient, and planarization of the dielectric.

As device geometries continue to shrink in size, and since stress is inversely proportional to area, it is of paramount importance to minimize stress during isolation processes as much as possible.

A 256 megabyte (MB) dynamic random access memory (DRAM) chip uses a "deep" trench array (as the capacitors) and STI to isolate the various transistors within the capacitor array. It has been determined that limiting the amount of oxide grown in the substrate is necessary to eliminate Si crystal defects in the trench-capacitor array. The method currently employed to "block-out" oxygen (O$_2$) in the Si substrate is the use of a thin (<5 nm) silicon nitride (Si$_3$N$_4$) film deposited by low-pressure chemical-vapor deposition (LPCVD) immediately after a thin oxide is grown in the STI. The thickness of the Si$_3$N$_4$ film is specified as being 5 nm or less. The reason for this thickness limitation is that this film has been found to be etch-resistant in hot phosphoric acid baths (e.g., to remove pad Si$_3$N$_4$) as well as in hydrofluoric acid baths (to remove thermally grown oxides). Thicker LPCVD-Si$_3$N$_4$ films used as Si$_3$N$_4$ liners in STI trenches have shown to etch readily in hot phosphoric acids.

One problem associated with the thin Si$_3$N$_4$ liner has been its propensity to trap electrical charge. The charge-trapping behavior (interface and bulk) of the Si$_3$N$_4$ liner has been observed to enhance STI-bounding leakage (N well to N well) in the sense amplifiers (i.e., "support circuitry") of the DRAMs, thus causing high standby currents. Recent data clearly shows that the Si3N4 liner lowers the threshold voltages (Vt) and enhances junction leakage by several orders of magnitude.

To ascertain the amount of charge that is trapped by the Si$_3$N$_4$ liner, blanket wafer experimental lots were processed consisting of (1) thermally-grown oxide (SiO$_2$-10 nm), (2) LPCVD-Si$_3$N$_4$ (4 nm), and (3) 10 nm SiO$_2$/4 nm LPCVD-Si$_3$N$_4$. Simple metal-insulator-semiconductor (MIS) structures were fabricated by depositing aluminum through a dot mask onto the insulating film(s). C—V measurements (low- and high-frequency) were conducted and result indicated that (1) the thin Si3N4 film alone contains approximately two orders of magnitude more charge-trapping states than the oxide (i.e., $10^{12}$ versus $10^{10}$), and (2) the combination of the oxide and Si$_3$N$_4$ decreases the density of charge-trapping states only marginally (e.g., $\sim5\times10^{11}$ versus $10^{10}$). Ideally, it would be best to develop or deposit a thin Si$_3$N$_4$ film that would not trap charge and still be resistant to hot phosphoric acid and hydrofluoric acid.

SUMMARY OF THE INVENTION

It is therefore an object of the present invention to provide a thin Si$_3$N$_4$ film which has a lower density of trapping centers than as-deposited LPCVD-Si$_3$N$_4$ and is an extremely effective as an O$_2$-barrier film yet is resistant to hot phosphoric acid and hydrofluoric acid.

According to the invention, thin crystalline Si$_3$N$_4$ films are applied in STI structures as O$_2$-barrier films. The crystalline Si$_3$N$_4$ contains a lower density of trapping centers, is more resistant to hot phosphoric acid etches and hydrofluoric acid etches than as-deposited LPCVD-Si$_3$N$_4$, and is extremely effective as an O$_2$-barrier film. The fact that crystalline Si$_3$N$_4$ has a lower density of trapping centers lowers, and in some cases prevents altogether, the parasitic transistor caused by the as-deposited LPCVD-Si$_3$N$_4$ film used in current STI technology. Furthermore, unlike the restrictive thicknesses that are specified in the current technology, this invention permits a larger range of crystalline Si$_3$N$_4$ thicknesses (e.g., 5 nm to 10 nm) to be used as O$_2$-barrier films in STI trenches. This allows a larger processing window for thickness controllability in manufacturing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
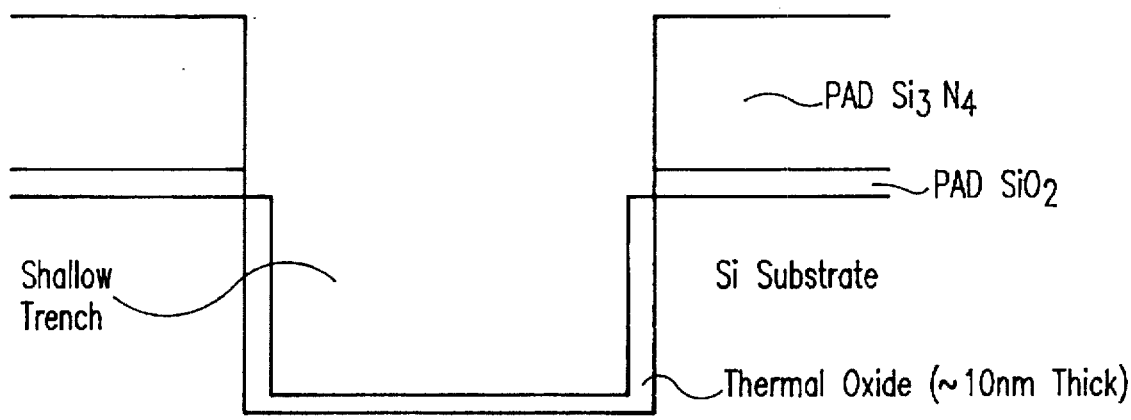
FIGS. 1A, 1B and 1C illustrate the process of forming thin crystalline Si$_3$N$_4$ films in STI structures.
Figure 1B:
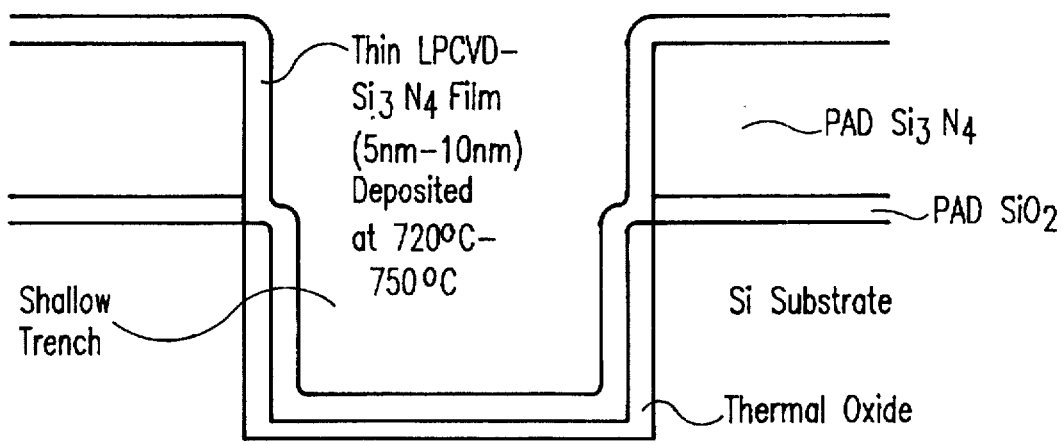
Figure 1C:
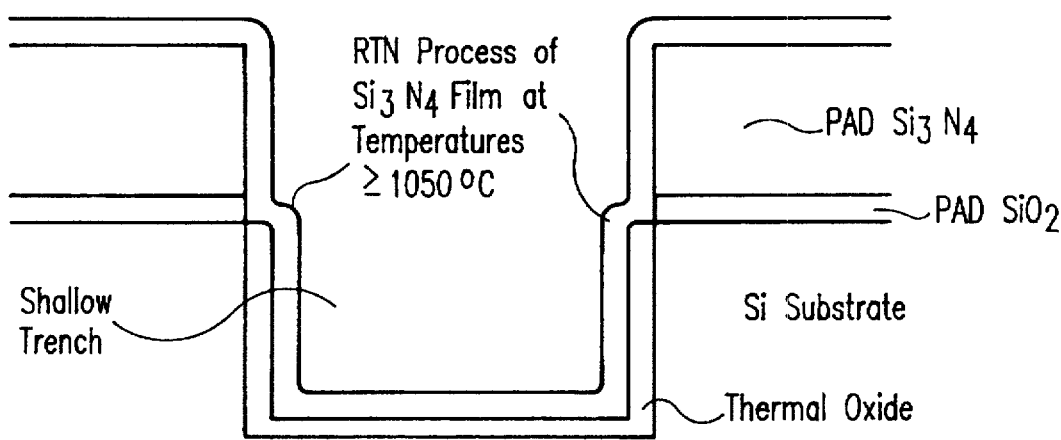

Referring now to the drawings, and more particularly to FIGS. 1A, 1B and 1C, there is shown the process of forming crystallized Si$_3$N$_4$ films in STI trenches according to the invention. In FIG 1A, after a shallow trench has been etched, a thin thermal oxide (typically 10 nm thick) is grown to remove etch damage. Next, in FIG. 1B, a thin Si$_3$N$_4$ film (5 to 10 nm) is deposited on top of the thermally-grown oxide layer in the STI trench. Then, in FIG. 1C, LPCVD-Si$_3$N$_4$ is typically deposited at temperatures of 720° C. to 780° C., and as such, is generally deposited in an amorphous state. Immediately after deposition, a high temperature, rapid thermal anneal in pure nitrogen (RTN) or ammonia (NH$_4$) is conducted. Crystallization of LPCVD-Si$_3$N$_4$ begins at 1050° C. and for anneal times on the order of 60 seconds. Temperatures greater than 1050° C. and/or anneal times greater than 60 seconds will induce further crystallization and grain growth of the LPCVD-$Si_3N_4$ film. In addition, thicker LPCVD-$Si_3N_4$ films (up to 10 nm) can be crystallized at temperatures less than 1100° C. This can be critically important in terms of limiting wafer warpage and slip line formation along wafer edges during the RTN process.

Figure 2A:
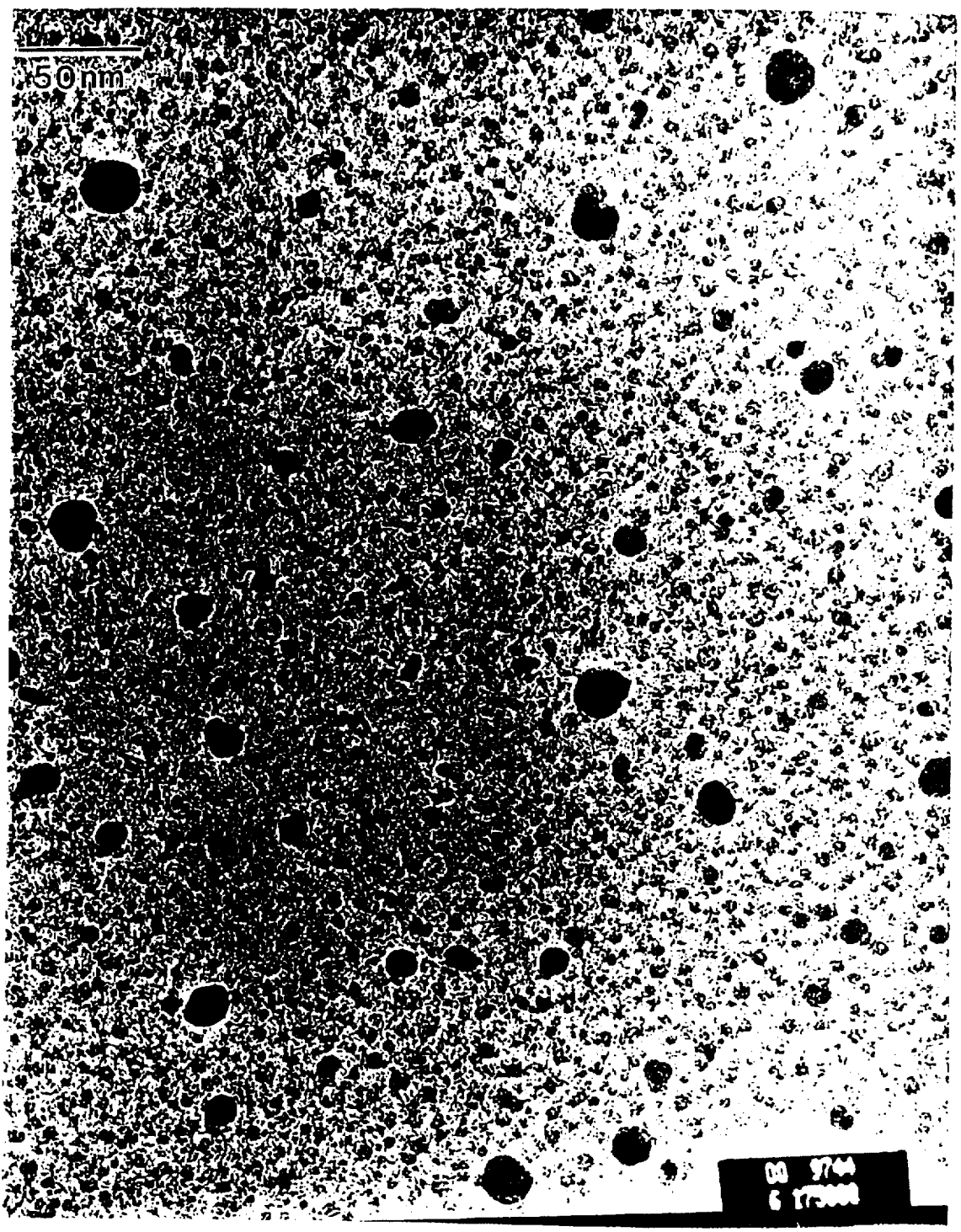
FIGS. 2A and 2B are, respectively, a bright-field transmission electron micrograph (TEM) of crystalline Si$_3$N$_4$ and an electron diffraction pattern of the TEM.
Figure 2B:

The typical morphology of crystalline $Si_3N_4$ is shown in FIGS. 2A and 2B. FIGS. 2A and 2B are bright-field transmission electron micrograph (TEM) and corresponding electron diffraction pattern, respectively, of a 10 nm $SiO_2$/4 nm $Si_3N_4$ insulator-couple that has been annealed at 1100° C. At 1100° C., the $Si_3N_4$ film is found to be largely crystalline. At 1050° C., the majority of the film is found to be amorphous; however, small crystallites of $Si_3N_4$ are observed. Electron diffraction analysis of samples annealed at 1050° C. and 1050° C. shows that the crystalline $S_3N_4$ film is the low-temperature, hexagonal ($\alpha$) $Si_3N_4$ phase.

Crystallized films of LPCVD-Si3N4 have much lower trap densities as compared to as-deposited LPCVD-$Si_3N_4$ films. Results of C—V measurements of 10 nm $SiO_2$/4 nm $Si_3N_4$ insulator-couples which have been crystallized by high temperature RTN anneals (1050° C. to 1150° C.) show that the trap density, at a minimum, has decreased by an order of magnitude. In addition, crystallized LPCVD-$Si_3N_4$ films show a heartier etch resistance to hot phosphoric acid and hydrofluoric acids. Etch rate studies show that crystallized LPCVD-$Si_3N_4$ films have, at a minimum, a 45% lower etch rate in hot phosphoric acid than as-deposited $Si_3N_4$ and as much as a 30% lower etch rate in pure hydrofluoric acid.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An improved shallow trench isolation (STI) structure for submicron integrated circuit devices comprising:

a shallow trench of 0.5 μm or less etched in a silicon substrate; and a thin crystalline $Si_3N_4$ liner 5 to 10 nm thick in said shallow trench.

2. The improved STI structure recited in claim 1 further comprising a thin thermal oxide film of approximately 10 nm thickness grown in said shallow trench, said thin crystalline $Si_3N_4$ liner being formed over the thin thermal oxide.

3. A crystalline silicone nitride ($Si_3N_4$) film in a shallow trench isolation (STI) structure comprising:

a shallow trench of 0.5 μm or less etched in a silicon substrate; and, a converted $Si_3N_4$ film 5 to 10 nm thick deposited by low-pressure chemical-vapor deposition (LPCVD) at a temperature between 720° C. to 780° C.

4. A crystalline silicone nitride ($Si_3N_4$) film in a shallow trench isolation (STI) structure as claimed in claim 3 wherein immediately after deposition of $Si_3N_4$ film, a rapid thermal anneal is conducted between 1050° C. and 1150° C. for approximately 60 seconds therefore converting said $Si_3N_4$ film from an amorphous state to a crystalline state.

5. A crystalline silicone nitride ($Si_3N_4$) film in a shallow trench isolation (STI) structure as claimed in claim 4 wherein said rapid thermal anneal is conducted at 1100° C. or less.

6. A crystalline silicone nitride ($Si_3N_4$) film in a shallow trench isolation (STI) structure as claimed in claim 4 wherein said rapid thermal anneal is conducted in pure nitrogen.

7. A crystalline silicone nitride ($Si_3N_4$) film in a shallow trench isolation (STI) structure as claimed in claim 4 wherein said rapid thermal anneal is conducted in ammonia.

8. A crystalline silicone nitride ($Si_3N_4$) film in a shallow trench isolation (STI) structure comprising:

a shallow trench of 0.5 μm or less etched in a silicon substrate;

a thermal oxide layer of approximately 10 nm thickness coating said shallow trench; and, a converted $Si_3N_4$ film of 5 to 10 nm thickness deposited over said thermal oxide layer by low-pressure chemical-vapor deposition (LPCVD) at a temperature between 720° C. to 780° C.

9. A crystalline silicone nitride ($Si_3N_4$) film in a shallow trench isolation (STI) structure as claimed in claim 8 wherein said converted $Si_3N_4$ film is formed by conducting a rapid thermal anneal between 1050° C. and 1150° C. immediately after deposition of $Si_3N_4$ film, for approximately 60 seconds, therefore converting said $Si_3N_4$ film from an amorphous state to a crystalline state.

10. A crystalline silicone nitride ($Si_3N_4$) film in a shallow trench isolation (STI) structure as claimed in claim 9 wherein said rapid thermal anneal is conducted at 1100° C. or less.

11. A crystalline silicone nitride ($Si_3N_4$) film in a shallow trench isolation (STI) structure as claimed in claim 9 wherein said rapid thermal anneal is conducted in pure nitrogen.

12. A crystalline silicone nitride ($Si_3N_4$) film in a shallow trench isolation (STI) structure as claimed in claim 9 wherein said rapid thermal anneal is conducted in ammonia.

13. A crystalline silicone nitride ($Si_3N_4$) film in a shallow trench isolation (STI) structure as claimed in claim 8 wherein said thermal oxide layer removes etch damage.

\* \* \* \* \*

UNITED STATES PATENT AND TRADEMARK OFFICE
CERTIFICATE OF CORRECTION

PATENT NO. : 5,747,866
DATED : May 5, 1998
INVENTOR(S) : Ho et al.

It is certified that error appears in the above-identified patent and that said Letters Patent is hereby corrected as shown below:

Title Page
At Item [73], following "Munich, Germany" insert --; International Business Machines Corporation, Armonk, New York--.

Signed and Sealed this

First Day of February, 2000

Attest:

Q. TODD DICKINSON

*Attesting Officer*   *Acting Commissioner of Patents and Trademarks*